United States Patent [19]

Pezzani

[11] Patent Number: 5,596,292

[45] Date of Patent: *Jan. 21, 1997

[54] A.C. SWITCH TRIGGERED AT A PREDETERMINED HALF-PERIOD

[75] Inventor: Robert Pezzani, Vouvray, France

[73] Assignee: SGS-Thomson Microelectronics S.A., Saint Genis Pouilly, France

[ * ] Notice: The term of this patent shall not extend beyond the expiration date of Pat. No. 5,471,074.

[21] Appl. No.: 470,206

[22] Filed: Jun. 7, 1995

Related U.S. Application Data

[60] Continuation of Ser. No. 448,899, May 24, 1995, which is a division of Ser. No. 32,680, Mar. 17, 1993, Pat. No. 5,471,074.

[30] Foreign Application Priority Data

Mar. 20, 1992 [FR] France .................................. 92 03763

[51] Int. Cl.⁶ .................................................. H01L 29/74
[52] U.S. Cl. ........................... 327/124; 327/438; 327/440; 257/119; 257/121; 257/126; 257/146
[58] Field of Search ..................... 257/119, 121, 257/126, 127, 146, 154, 167, 175; 327/124, 438, 440

[56] References Cited

U.S. PATENT DOCUMENTS

| | | |
|---|---|---|
| 3,310,687 | 3/1967 | Howell ..................... 257/119 |
| 3,489,926 | 1/1970 | Adams et al. . |
| 3,495,097 | 2/1970 | Abramson et al. . |
| 3,996,604 | 12/1976 | Hutson . |
| 4,060,824 | 11/1977 | Hutson . |
| 4,190,853 | 2/1980 | Hutson . |
| 4,282,555 | 8/1981 | Syedberg . |
| 4,509,089 | 4/1985 | Syedberg . |
| 4,546,401 | 10/1985 | Syedberg . |
| 4,742,382 | 5/1988 | Jrecldin . |
| 4,866,500 | 9/1989 | Nishizawa et al. . |
| 5,471,074 | 11/1995 | Pezzani ..................... 257/175 |

OTHER PUBLICATIONS

Patent Abstracts of Japan, vol. 5, No. 177 (E–82)(851) 17 Nov. 1981 & JP–A–56 104 467 (Nippon Denshin Denwa Kosha) 30 Apr. 1981.

Patent Abstracts of Japan, vol. 10, No. 337 (E–454)(2392) 14 Nov. 1986 & JP–A–61 140 174 (Hitachi Ltd) 27 Jun. 1986.

*Primary Examiner*—Ngân V. Ngô
*Attorney, Agent, or Firm*—David M. Driscoll; James H. Morris

[57] ABSTRACT

An a.c. switch includes across first and second main terminals a first thyristor disposed in parallel with, but in an opposite direction of, a first diode and in series with a second thyristor disposed in parallel with but in an opposite direction of, a second diode. The first thyristor has a gate terminal connected to its gate area. The second thyristor and second diode are vertically realized in the same substrate, their conduction areas being closely interlaced, whereby a polarity inversion following a conduction period of the second diode causes the second thyristor to become conductive.

2 Claims, 3 Drawing Sheets

A.C. SWITCH TRIGGERED AT A PREDETERMINED HALF-PERIOD

This application is a continuation of prior application Ser. No. 08/448,899 entitled A. C. SWITCH TRIGGERED AT A PREDETERMINED HALF-PERIOD, filed on May 24, 1995, which in turn is a division of application Ser. No. 08/032,680, filed on Mar. 17, 1993, now U.S. Pat. No. 5,471,074.

BACKGROUND OF THE INVENTION

1. Field of the Invention

The present invention relates to medium or high power a.c. switches and more particularly to the realization in monolithic form of an a.c. switch triggerable only during a predetermined half-period and remaining automatically conductive during the next half-period.

2. Discussion of the Related Art

Presently, the triac, whose conduction state is triggered by a signal applied between its gate and one of its main terminals, is a commonly used a.c. switch. This switch is blocked again at each zero crossing of the current; hence, it has to be controlled at each half-period.

The operation of a triac is schematically illustrated with reference to FIGS. 1A–1D where FIG. 1A shows the mains voltage waveform, FIG. 1B shows the control pulses $I_g$ provided to the triac gate, FIG. 1C shows the current flowing through the triac, and FIG. 1D shows the voltage across the triac. For the sake of simplification, it is assumed in this example that there is no phase shift between the voltage and the current.

It can be appreciated that, if a control pulse $I_g$ is applied during a positive or negative half-period of the mains voltage, the triac goes into conduction mode and that it is blocked again at each zero crossing of the current and remains blocked if no control pulse is applied thereto.

Such a component has proven efficient for power regulating in phase control mode. Some drawbacks, however, are inherent in the triac structure and in some applications.

The geometrical structure of a triac is complex, particularly regarding the areas corresponding to the gate region, which renders manufacturing of the triac difficult.

This complex geometrical structure limits the performances of the triac which generally has a poor gate sensitivity. So, in some applications where a high sensitivity is required, a thyristor combined with a rectifying bridge is substituted for the triac, that is, a monolithic component is not used.

In some applications, for example when the switch is disposed in series with a transformer, it is more advantageous, after a quiescent phase, to trigger the triac again during a half-period having a polarity opposite to the polarity of the last conduction phase in order to avoid the drawbacks associated with an excessive current surge caused by magnetization/demagnetization phenomena. Because of these phenomena, it is compulsory to combine the triac with complex control circuits which store the polarity of the last conduction half-period and authorize a next triggering only during a half-period having the opposite polarity.

SUMMARY OF THE INVENTION

To avoid the latter drawback, an object of the invention is to realize a monolithic component having the characteristics illustrated in FIGS. 2A–2D where FIG. 2A, like FIG. 1A, shows the mains voltage; FIG. 2B shows the control pulse $I_g$ applied to the component gate; and FIGS. 2C and 2D show current I through the component and the voltage V across the component terminals, respectively. The purpose of the invention is that a control pulse $I_{g1}$ occurring during a half-period having a determined, for example positive, polarity of the mains voltage causes the switch to be conductive during the end of the present half-period and during the whole next half-period, whereas a control pulse $I_{g2}$ occurring during a half-period having a polarity opposite the polarity of the mains voltage does not affect the conduction of the switch.

Another object of the invention is to provide such a monolithic component having a simple geometrical structure.

A further object of the invention is to provide such a monolithic component with desired characteristics, such as gate sensitivity, forward and reverse breakdown voltage, and ability to withstand parasitic dI/dT and dV/dT triggering.

To achieve these objects and others, the invention provides a monolithic semiconductor component forming an a.c. switch including first and second main terminals and a gate terminal. Between the first and second main terminals, a first thyristor is disposed in parallel with, but in an opposite direction of, a first diode and in series with a second thyristor disposed in parallel with, but in an opposite direction of, a second diode. The first thyristor has a control terminal connected to its gate area. The second thyristor and the second diode are vertically realized in the same substrate and their conduction areas are closely interlocked, whereby a polarity inversion following a conduction period of the second diode causes the second thyristor to become conductive.

The a.c. switch realized in the form of a monolithic component from a low doped semiconductor substrate, of a first conductivity type, includes, from its upper surface, first and second separate regions of a second conductivity type. A portion of the first region is part of a gate electrode and includes a diffusion of a third region of a first conductivity type. The third region and a portion of the first region are coated with a metallization. The lower surface of the component includes, beneath the third region, a fourth region of the second conductivity type, and beneath the rest of the second region, a fifth region of the first conductivity type. The second region includes separated areas of the first conductivity type. The lower surface of the substrate includes, in front of the second region, sixth and seventh alternate and separated regions of the first and second conductivity type. The lower surface is coated with a metallization as well as the surface of the second region and the separated areas.

According to an embodiment of the invention, the seventh regions are interposed between the projections of the separated areas.

According to an embodiment of the invention, an eighth region of the first conductivity type having a high doping level with respect to that of the substrate is interposed between the first and second regions.

According to an embodiment of the invention, a ninth region of the first conductivity type having a high doping level with respect to that of the substrate is disposed at the periphery of the upper surface of the substrate.

The foregoing and other objects, features, aspects and advantages of the invention will become apparent from the following detailed description of the present invention

DETAILED DESCRIPTION

Figure 1A:
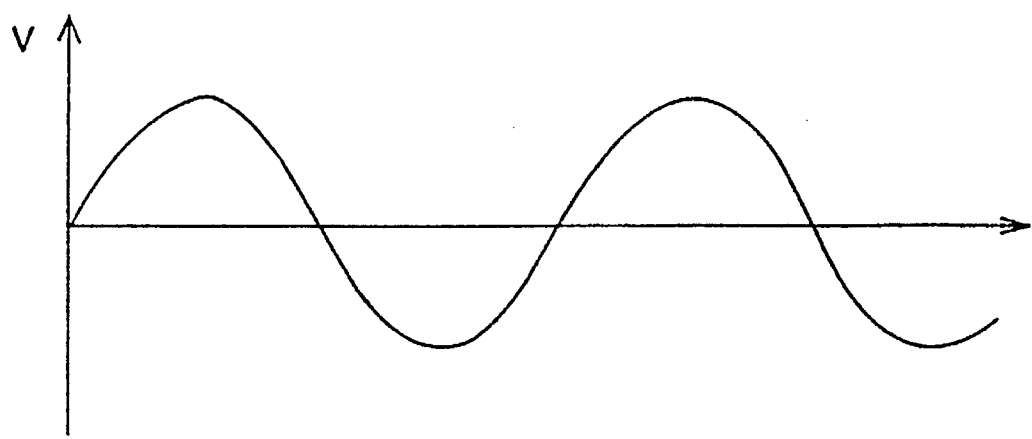
FIGS. 1A–1D are timing diagrams schematically showing the operation of a conventional triac.
Figure 1B:
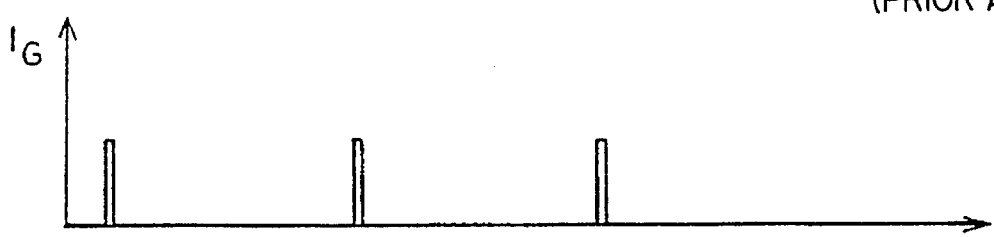
Figure 1C:
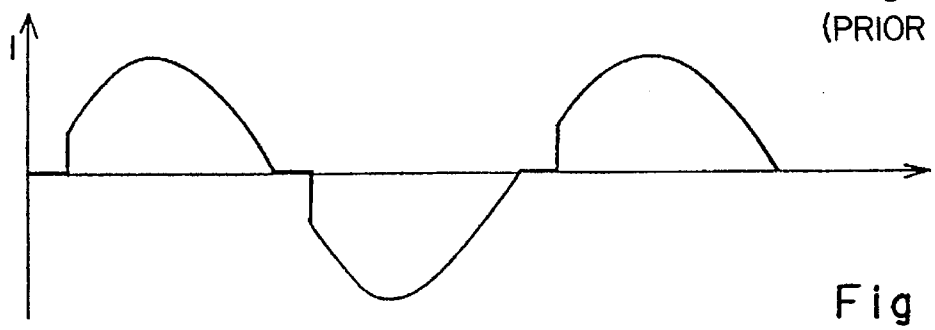
Figure 1D:
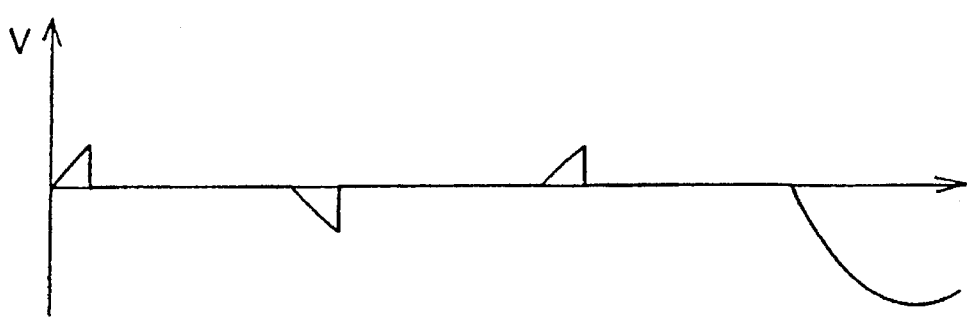
Figure 2A:
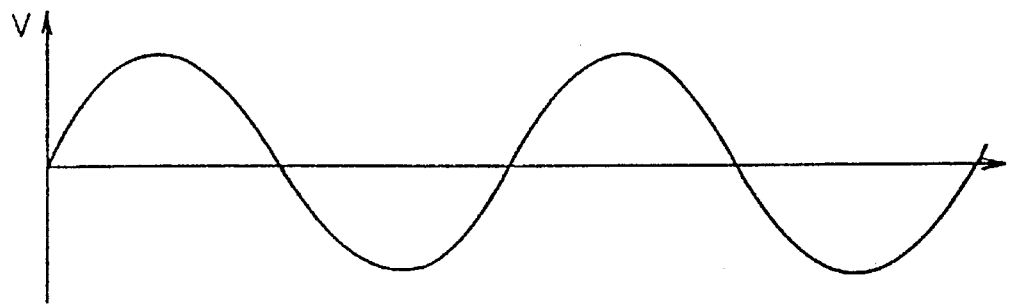
FIGS. 2A–2D are timing diagrams schematically showing the desired operation mode of a component according to the invention.
Figure 2B:
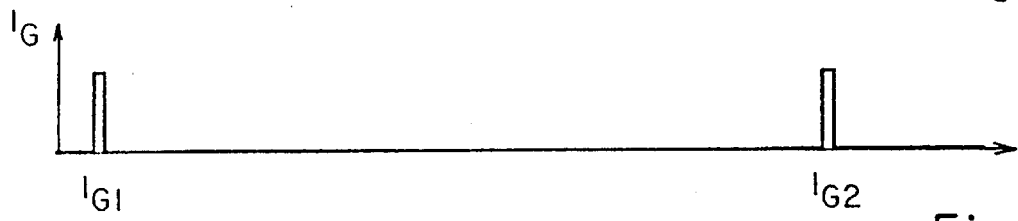
Figure 2C:
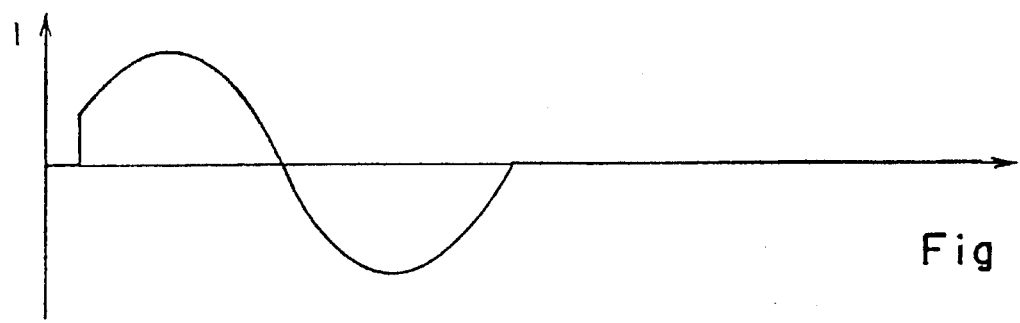
Figure 2D:
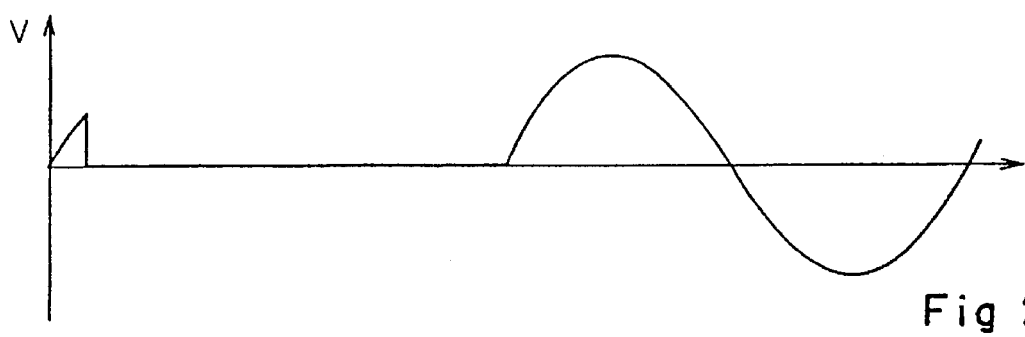
Figure 3:
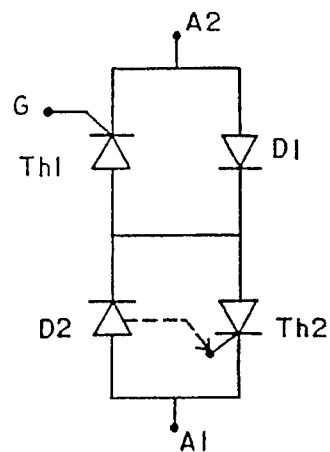
FIG. 3 is a circuit diagram of an equivalent circuit of a component according to the invention.

As shown in FIG. 3, the invention aims to realize a monolithic semiconductor component including a first conventional thyristor Th1 with a gate electrode G, in parallel with, but in an opposite direction than, (referred to as anti-parallel), a diode D1. Diode D1 is disposed in series with a second thyristor Th2 which is in anti-parallel with a diode D2, the component being connected across terminals A2 and A1. Thus, the component includes two main terminals A2 and A1, and a gate terminal G. Thyristor Th2 is such that it becomes automatically conductive during a half-period when diode D2 has been conductive during the preceding half-period. Thus, if terminal A1 is positive with respect to terminal A2, the current is capable of flowing across terminals A1 and A2 through diode D2 and thyristor Th1 provided that thyristor Th1 has received a gate control pulse. When terminal A2 is positive with respect to terminal A1, the current flows through diode D1 and thyristor Th2 provided that diode D2 has been conductive during the preceding half-period.

Figure 4:
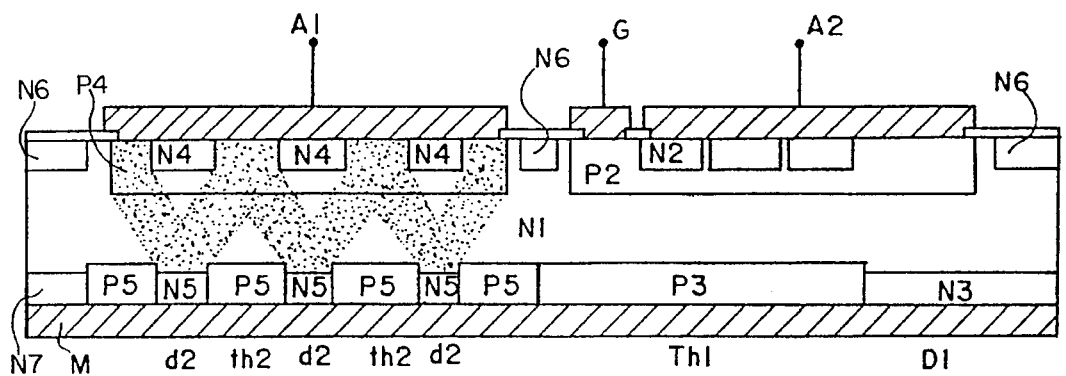
FIG. 4 is a schematic cross-sectional view, not drawn to scale, of a component according to the invention.

FIG. 4 is a schematic cross-sectional view of an exemplary embodiment of a component according to the invention.

In the right-hand portion of FIG. 4 is shown the conventional structure of a thyristor with an anti-parallel diode. The left-hand portion of the drawing shows components D2, and Th2, as disclosed hereinafter.

Firstly, the right-hand portion of the component structure will be described. The component is formed from an N-type substrate N1, in the upper surface of which is diffused a P-type layer P2 forming the thyristor gate layer and the anode layer of diode D1. An N-type region N2 is diffused in region P2 so as to form the thyristor cathode. The drawing conventionally shows areas of region P2 passing through layer N2 up to the component surface and constituting, as conventionally termed, emitter shorts. As is known, these emitter shorts are very small and are, for example, approximately 50 μm in diameter. The right-hand portion of region P2 does not include any diffused region N2 and corresponds to the anode of diode D1. Beneath the thyristor portion of region P2 (the one where region N2 is diffused), is formed, from the lower surface of the component, a P-type region P3 corresponding to the anode of thyristor Th1. Beneath the diode portion of region P2 (where no N-type diffusion is made, other than the gate area), is formed, from the lower surface of the substrate, an N-type region N3 corresponding to the cathode of diode D1. Preferably, region P3 externally protrudes over the projection of region N2 in order to avoid any interference between the conduction of diode D1 and conduction of thyristor Th1. The structure will not be described in more detail since it is the same as the conventional structure of a thyristor with an anti-parallel diode. A metallization A2 is deposited on layers N2 and P2. The lower surface is coated with a metallization M in order, especially, to contact regions P3 and N3.

In the left-hand portion of FIG. 4, is shown a structure formed, in an interdigited manner, of thyristors and vertical diodes.

In the upper surface of substrate N1 is formed a region P4, realized simultaneously with region P2. In region P4 are formed, so as to be substantially spaced, N-type regions N4, realized simultaneously with region N2. From the lower surface of the substrate are formed alternate regions P5 and N5. Preferably, although not compulsory, regions N5 are disposed in register with regions N4. A metallization A1 is formed over the combination of region P4 and incorporated regions N4. Regions P5 and N5 are covered by metallization M of the lower surface. Thus, between metallizations A1 and M, are disposed elemental thyristors th2 formed by layers N4-P4-N1-P5, the electrode A1 of which forms the cathode and metallization M forms the anode. There is also provided elemental diodes d2 formed by layers P4-N1-N5, whose electrode A1 forms the anode and metallization M forms the cathode.

When electrode A1 is positive with respect to electrode A2 and thyristor Th1 is controlled to go into the conductive state, current flows through the elemental diodes d2, establishing conduction areas drawn in dashed lines in the left-hand portion of the drawing.

At the moment when the voltage is reversed across the component, the current is inhibited. However, the charges injected during the preceding conduction state of diodes d2 in the neighborhood of the elemental thyristors th2, do not instantaneously disappear, especially the charges in excess in the low doped layer N1. Thus, the small-size thyristors th2 which are forward biased have still charges in their layer N1. These charges play the role of a gate current and cause thyristors th2 to be naturally triggered. Therefore, the conduction is established from A2 to A1 through diode D1 and thyristors th2 without any external action. This conduction is continued until the current is cancelled across terminals A1 and A2. However, thyristor Th1 which, conventionally, has a structure clearly separated from the structure of diode D1, is not automatically triggered since layer N1 does not include any carrier below the cathode region of thyristor Th1.

Figure 5:
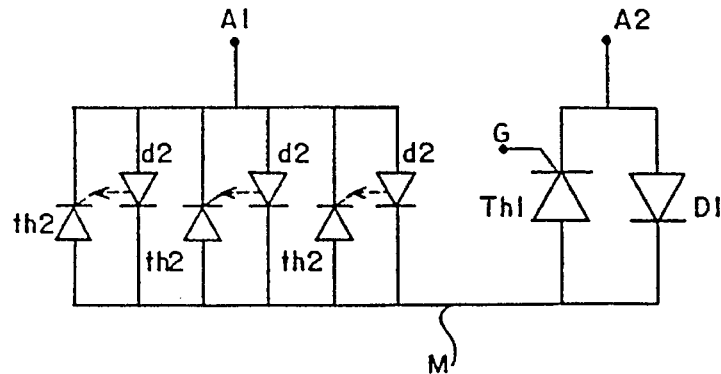
FIG. 5 is a more detailed circuit diagram of an equivalent circuit of a component according to the invention.

FIG. 5 shows an equivalent circuit of the structure of FIG. 4, of the same type as that of FIG. 3. FIG. 5 schematically shows diodes d2 and thyristor th2.

The invention has been described very schematically. Those skilled in the art will be capable of adapting the doping levels of the various layers to meet specific requirements and various alternative structures will clearly appear to them. For example, as shown in FIG. 4, N-type regions N6 can be provided between regions P2 and P4 and at the upper periphery of the component, as well as a region N7 at the lower periphery of the component.

As regards thyristor Th1 and diode D1, all the conventional improvements known in the art can be made. For example, the thyristor can be of the gate-amplification type.

To ensure that the component according to the invention has symmetrical characteristics for currents flowing in both directions, the silicon surfaces must match one another. Let S1 be the surface of region N2 (neglecting the small-surface emitter shorts), and S2 the surface of region P2 corresponding to diode D1 (surface S2 generally is approximately half the surface S1), the whole surface of regions N4 will be selected roughly equal to S1, the distributed surface portions of region P4 having a surface roughly equal to surface S2.

Various geometrical patterns can be adopted for realization of the component according to the invention. For example, as viewed from above, regions N4 can be achieved like stripes interlaced with the stripes of region P4.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. A method for enabling/disabling alternating current flow across first and second terminals comprising the steps of:

providing a first thyristor and a first diode connected in parallel and to the first terminal;

providing a second diode and a second thyristor, the second diode connected between the first diode and the second terminal and the second thyristor connected in parallel with the second diode and to the second terminal;

receiving a triggering pulse by the first thyristor; and upon receipt of the triggering pulse, enabling current to flow across the first and second terminals and through the first and second diodes and first and second thyristors for a remaining half-cycle of a present alternating current period and a half-cycle of a subsequent alternating current period.

2. A method for enabling/disabling alternating current flow across first and second terminals comprising the steps of:

receiving a triggering pulse by a circuit element coupled to the first terminal; and upon receipt of the triggering pulse, enabling alternating current to flow across the first and second terminals for a remaining half-cycle of a present alternating current period and a half-cycle of a subsequent alternating current period.

* * * * *